US011368164B2

(12) United States Patent
Torfs et al.

(10) Patent No.: US 11,368,164 B2
(45) Date of Patent: Jun. 21, 2022

(54) ANALOG INTERLEAVERS (71) Applicants: UNIVERSITEIT GENT, Ghent (BE); IMEC VZW, Leuven (BE)

(72) Inventors: Guy Torfs, De Pinte (BE); Hannes Ramon, Sint-Denijs-Westrem (BE); Xin Yin, Sint-Denijs-Westrem (BE)

(73) Assignees: UNIVERSITEIT GENT, Ghent (BE); IMEC VZW, Leuven (BE)

(*) Notice: Subject to any disclaimer, the term of this patent is extended or adjusted under 35 U.S.C. 154(b) by 0 days.

(21) Appl. No.: 17/284,661

(22) PCT Filed: Oct. 11, 2019

(86) PCT No.: PCT/EP2019/077672
§ 371 (c)(1),
(2) Date: Apr. 12, 2021

(87) PCT Pub. No.: WO2020/078861
PCT Pub. Date: Apr. 23, 2020

(65) Prior Publication Data
US 2021/0399736 A1 Dec. 23, 2021

(30) Foreign Application Priority Data
Oct. 15, 2018 (EP) .................................. 18200560

(51) Int. Cl.
*H03K 9/00* (2006.01)
*H03M 1/66* (2006.01)
*H03M 1/08* (2006.01)
(52) U.S. Cl.
CPC ............. *H03M 1/662* (2013.01); *H03M 1/08* (2013.01)

(58) Field of Classification Search
CPC .................................. H03M 1/662; H03M 1/08
USPC .................................. 375/216, 219, 295, 296
See application file for complete search history.

(56) References Cited

U.S. PATENT DOCUMENTS

2007/0043982 A1* 2/2007 Arivoli ................. H04L 1/0043
714/701

FOREIGN PATENT DOCUMENTS

EP 2782257 A2 9/2014

OTHER PUBLICATIONS

International Search Report and Written Opinion from PCT Application No. PCT/EP2019/077672, dated Jan. 2, 2020.
Extended European Search Report from corresponding EP Application No. 18200560.3, dated Apr. 2, 2019.
(Continued)

*Primary Examiner* — Zewdu A Kassa
(74) *Attorney, Agent, or Firm* — Workman Nydegger (57) ABSTRACT

An interleaver for combining at least two incoming signals into an analog output signal includes at least a first signal path and a second signal path. Each signal path has: an input terminal, a first gain stage for multiplying a signal coming from the input terminal with a first gain (a) to obtain a first signal, a mixer and a second gain stage for multiplying a signal coming from the input terminal with a second gain (b) before or after mixing it with a clock signal to obtain a second signal, an adder for adding the first and second signal to obtain an output signal of the signal path wherein the first and second gain are different from zero. The interleaver comprises an adder for adding the output signals from the signal paths.

13 Claims, 12 Drawing Sheets

(56) References Cited

OTHER PUBLICATIONS

Deveugele et al., "Parallel-Path Digital-to-Analog Converters for Nyquist Signal Generation," IEEE Journal of Solid-State Circuits, vol. 39, No. 7, Jul. 31, 2004, pp. 1073-1082.
Nagatani et al., "A 50-GHz-Bandwidth InP-HBT Analog-MUX Module for High-Symbol-Rate Optical Communications Systems," IEEE MTT-S International Microwave Symposium (IMS), May 22, 2016, 4 pages.
Yamazaki et al., "Digital-Preprocessed Analog-Multiplexed DAC for Ultrawideband Multilevel Transmitter," Journal of Lightwave Technology, vol. 34, No. 7, Apr. 1, 2016, pp. 1579-1584.

\* cited by examiner

ANALOG INTERLEAVERS

FIELD OF THE INVENTION

The present invention relates to digital to analog converters. More specifically it relates to interleaving digital to analog converters which are designed for obtaining an increased sample rate.

BACKGROUND OF THE INVENTION

Developing high-speed digital-to-analog converters (DAC) at rates above 50 Gs/s is difficult. The Nyquist criterion states that higher conversion rates make it possible to generate data with a higher bandwidth. However, for high speed DACs, the required bandwidth of the DAC and channel also becomes a limiting factor.

A higher speed DAC may be achieved by combining two analog signals. The main goal thereby is to have two lower speed DACs, and then combine them to have an interleaved output.

In a first prior art topology parallel-path digital to-analog converter, two signals from two different DACs with 180 clock phase difference are interleaved by addition. Such a DAC is described in the work of J. Deveugele, P. Palmers and M. S. J. Steyaert, "Parallel-path digital-to-analog converters for Nyquist signal generation," in IEEE Journal of Solid-State Circuits, vol. 39, no. 7, pp. 1073-1082, July 2004. By adding both signals generated by two 180 degree spaced DACs running at sample frequency $f_s$, the sampling images that are mirrored around $f_s/2$ are canceled. The spectrum appears to be generated by a single DAC running at $2*f_s$ and the data is interleaved. Because of the fact that each DAC performs zero-order-hold interpolation between two samples, the output spectrum is shaped with a sinc function. This sinc function is normally zero at $2*f_s$ when the full rate equivalent DAC is running at $2*f_s$. However, when using the addition interleaver, the sinc function is still zero at $f_s$ even though the converter has the distortion and image spectrum of a DAC running at $2*f_s$. This is a disadvantage because the zero cannot be compensated and only data with a bandwidth below $f_s/2$ can be generated even though the equivalent DAC is running at $2*f_s$.

A second prior art interleaver topology is disclosed in M. Nagatani et al., "A 128-GS/s 63-GHz-bandwidth InP-HBT-based analog-MUX module for ultrabroadband D/A conversion subsystem," 2017 IEEE MTT-S International Microwave Symposium (IMS), Honololu, Hi., 2017, pp. 134-136. The proposed interleaver is a switch that choses one part of the clock cycle one signal input and the other part of the clock cycle the other input. This is achieved by linearization of standard digital current mode logic multiplexers. Due to the switching of the output signal between two input signals, there is clock feedthrough resulting in extra mixing products between the wanted signal and the DAC clock frequency.

In view of these shortcomings there is room for improvement in the design of digital to analog converters.

SUMMARY OF THE INVENTION

It is an object of embodiments of the present invention to provide a good interleaver for combining at least two incoming signals into a time interleaved analog output signal.

The above objective is accomplished by a method and device according to the present invention.

In a first aspect embodiments of the present invention relate to an interleaver for combining at least two incoming signals into a time interleaved analog output signal. The interleaver comprises:
at least a first signal path and a second signal path,
each signal path comprising:
an input terminal for receiving an incoming signal,
a first gain stage adapted for multiplying a signal coming from the input terminal with a predefined or modifiable first gain (a) to obtain a first signal,
a mixer and a second gain stage adapted for multiplying a signal coming from the input terminal with a predefined or modifiable second gain (b) before or after mixing it with a clock signal using the mixer to obtain a second signal,
an adder adapted for adding the first signal and the second signal to obtain an output signal of the signal path wherein the first and second gain are different from zero,
the interleaver moreover comprises an adder adapted for adding the output signals from the signal paths to obtain the analog signal at an output terminal of the interleaver.

It is an advantage of an interleaver in accordance with embodiments of the present invention that it is able to interleave the incoming data signals.

It is an advantage of embodiments of the present invention that the spectrum of the interleaved signal is not altered.

It is an advantage of embodiments of the present invention that there is no visible difference between the ideal full rate digital-to-analog converter (DAC) and the interleaving of two half-rate DACs in accordance with embodiments of the present invention.

Prior art systems wherein the interleaver choses one part of a clock cycle one signal input and the other part of the clock cycle the other input have the disadvantage that due to the switching of the output signal between two input signals, there is clock feedthrough and extra mixing products are obtained between the wanted signal and the DAC clock frequency. It is an advantage of embodiments of the present invention that such clock feedthrough is canceled and therefore also no additional frequency spurs are present, which may be present in prior art systems.

It is an advantage of embodiments of the present invention that they comprise an intrinsic feed-forward equalizer (FFE). It is therefore not required to place a feed-forward equalizer in front or after the interleaver. In embodiments of the present invention the built-in feed forward equalizing function naturally follows from the proposed interleaver architecture. The FFE is a beneficial and wanted side-product of the used architecture. It is an advantage of embodiments of the present invention that this FFE can be configured to compensate bandwidth limitation of the interleaver itself, the device creating the input signals or other parts in the signal chain.

In embodiments of the present invention the interleaver comprising a clock module adapted for generating clock signals for the mixers of the signal paths.

In embodiments of the present invention the first gain is equal to the second gain for each signal path.

It is an advantage of embodiments of the present invention that a perfect interleaver is created when the first gain is equal to the second gain for each signal path.

In embodiments of the present invention for at least one of the signal paths the first gain is different from the second gain.

It is an advantage of embodiments of the present invention that the interleaver also behaves as an equalizer.

In embodiments of the present invention each gain stage is implemented by two differential pairs in parallel and each gain stage is adapted for generating a current by subtracting currents generated by the differential pairs.

It is an advantage of embodiments of the present invention that the gain of the gain stages can be realized by two differential pairs in parallel.

In embodiments of the present invention each gain stage is adapted for biasing the differential pairs with complementary currents.

In embodiments of the present invention the mixer of each signal path comprises cascode transistors which are adapted to be driven by a clock signal and for alternating the sign of the current generated by the gain stage at a rate of the clock signal.

In embodiments of the present invention the adder of each signal path comprises output resistors which are configured for summing the first signal and the second signal of the signal path.

In embodiments of the present invention the adder adapted for adding the output signal from the first signal path with the output signal from the second signal path comprises two differential pairs of which one is adapted for generating a current in function of the output signal from the first signal path, and of which the other one is adapted for generating a current in function of the output signal from the second signal path, and wherein the obtained currents are summed in output resistors.

In a second aspect embodiments of the present invention relate to a staged interleaver comprising at least two stages of which at least:
a second stage comprising an interleaver according to embodiments of the present invention,
and a first stage comprising at least a first and a second interleaver having the features of an interleaver according to embodiments of the present invention except for the fact that the second gain of one of the signal paths may be zero, wherein the output terminals of the interleavers of the first stage are connected with the input terminals of the signal paths of the interleaver of the second stage.

It is an advantage of embodiments of the present invention that the architecture of an interleaver in accordance with embodiments of the present invention can be extended towards a higher order interleaver by combining basic interleaving blocks.

It is an advantage of a staged interleaver that the same architecture can be used and that it can be reconfigured into different modes by changing the gains of the different gain stages. In embodiments of the present invention it is for example possible to reconfigure into 4-1 mode, 2-1 mode, PAM-4 mode.

It is an advantage of embodiments of the present invention that a 2-1 mode can be obtained using a staged interleaver in accordance with embodiments of the present invention.

In embodiments of the present invention the first gain of the second signal path is half of the first gain of the first signal path, for the interleavers of the first stage. For these embodiments the second gain of the second signal paths may be zero for the interleavers of the first stage. It is advantageous that PAM4 generation is possible using a staged interleaver in accordance with embodiments of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 1:
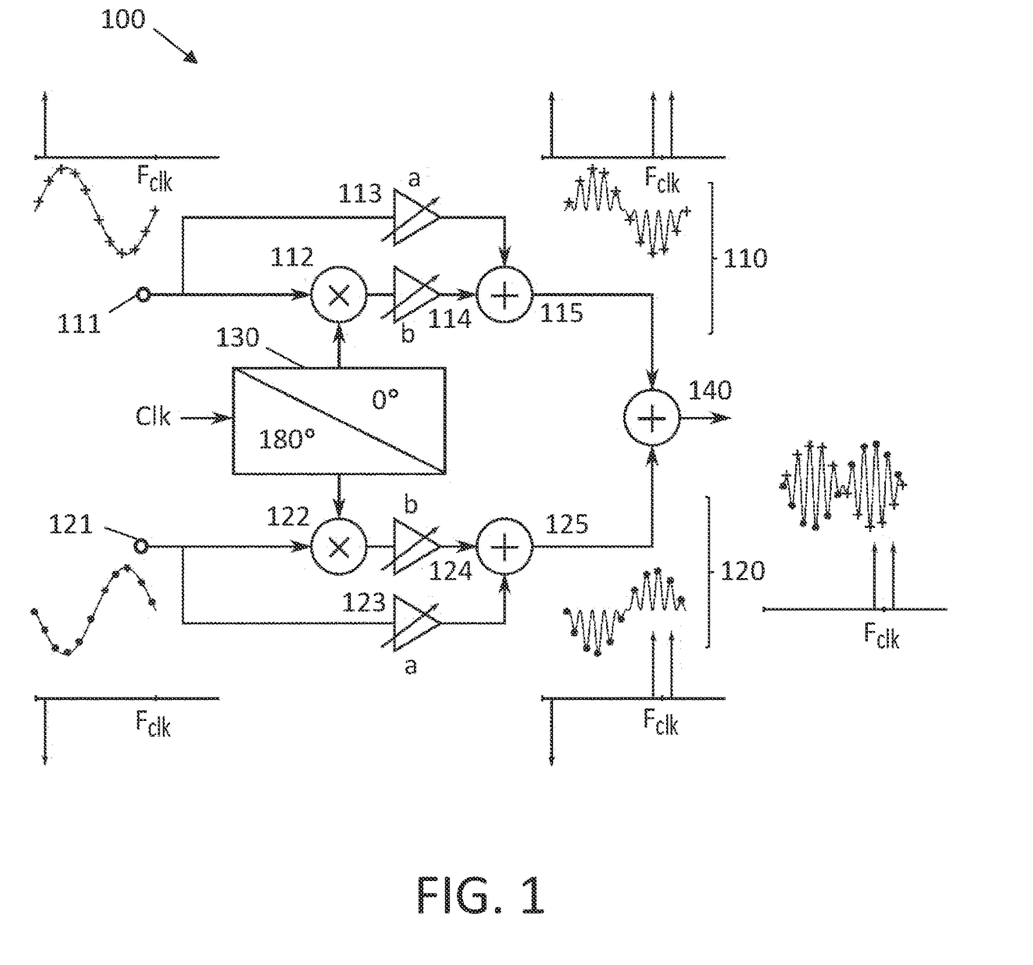
FIG. 1 shows an exemplary interleaver in accordance with embodiments of the present invention.

In a first aspect embodiments of the present invention relate to an interleaver 100 for combining at least two incoming signals into an analog output signal. The interleaver 100 comprises at least a first signal path 110 and a second signal path 120.

Each signal path 110, 120 comprises:
an input terminal 111, 121 for receiving an incoming signal,
a first gain stage 113, 123 adapted for multiplying a signal coming from the input terminal 111, 121 with a predefined or modifiable first gain (a) to obtain a first signal,
a mixer 112, 122 and a second gain stage 114, 124 adapted for multiplying a signal coming from the input terminal 111, 121 with a predefined or modifiable second gain (b) before or after mixing it with a clock signal using the mixer 112, 122 to obtain a second signal,
an adder 115, 125 adapted for adding the first signal and the second signal to obtain an output signal of the signal path 110, 120 wherein the first and second gain are different from zero.

The interleaver 100 moreover comprises an adder 140 adapted for adding the output signal from the signal paths 110, 120 to obtain the analog signal at an output terminal of the interleaver 100.

In embodiments of the present invention the interleaver may comprise exactly two input paths. A first clock signal is applied to the mixer of the first signal path and a second clock signal is applied to the mixer of the second signal path. The second clock signal may be 180° out of phase with the first clock signal.

In embodiments of the present invention the interleaver may comprise a clock module 130 adapted for generating clocks signals for the mixers 112, 122 of the signal paths 110, 120. In embodiments of the present invention there may be two signal paths and the clock is adapted for generating a first clock signal and a second clock signal starting from an input clock such that the second clock signal is 180° out of phase with the first clock signal, wherein the clock signal for the mixer 112 of the first signal path 110 is the first clock signal, and wherein the clock signal for the mixer 122 of the second signal path 120 is the second clock signal.

FIG. 1 shows an exemplary interleaver in accordance with embodiments of the present invention. It consists of two input signals that are mixed with the interleaver clock (Clk). A first input signal (the crosses) is applied to the first input terminal 111 and a second input signal (the dots) is applied to the second input terminal. Only at the crosses (for the first input signal) or the dots (for the second input signal) the signal goes through. In this exemplary embodiment of the present invention the second input signal has the opposite phase of the first input signal.

In the first signal path 110, the signal coming from the first input terminal is multiplied at the first gain stage 113 with a gain (a, which may be variable) to obtain a first signal. In parallel the signal coming from the first input terminal is multiplied at a second gain stage 114 with a second gain (b, which may be variable) and mixed with a clock signal coming from a clock module 130 to obtain a second signal. The obtained first and second signal are summed together resulting in an output signal of the first signal path.

Similarly, in the second signal path 120, the signal coming from the second input terminal is multiplied at the first gain stage 123 with a gain (a, which may be different from the gain in the first signal path and which also may be variable) to obtain a first signal. In parallel the signal coming from the second input terminal is multiplied at a second gain stage 124 with a second gain (b, which may be different from the gain in the first signal path and which also may be variable) and mixed with a clock signal coming from a clock module 130 to obtain a second signal. In this exemplary embodiment of the present invention the clock signal applied to the mixer of the second signal path is 180° out of phase with the clock applied to the mixer of the first signal path. The obtained first and second signal are summed together resulting in an output signal of the second signal path.

The output signal of the first signal path and the output signal of the second signal path are summed by the adder 140.

In this exemplary embodiment a binary tree structure is shown. The invention is, however, not limited thereto. An interleaver according to embodiments of the present invention may comprise more than 2 signal paths of which the outputs are added together (e.g. 4 signal paths may be added in a 4-input adder).

In the exemplary embodiment illustrated in FIG. 1 a clock module is used which generates two clocks which are 180° phase shifted with respect to each other. The invention is, however, not limited thereto. It is also possible to apply different clock phases to the circuit. In embodiments of the present invention the clock phases may be generated using a delay locked loop.

In the exemplary embodiment illustrated in FIG. 1 the signals and their corresponding frequencies are shown at different points in the structure (at the input terminals, in front of the adder 140, and at the output of the adder 140).

In embodiments of the present invention a high-speed digital-to-analog converter is obtained by using e.g. two half rate DACs at the input terminals and by interleaving the outputs of the DACs to obtain a full rate converted output. The interleaver is able to interleave and equalize the data simultaneously. As such the bandwidth of the DAC and interleaver can be extended.

The interleaver of FIG. 1 is able to interleave data up to the sample frequency of the DACs $f_s$ (which is the same as the frequency of the Clk $F_{clk}$ of FIG. 1) since the output spectrum is the same as that of a DAC running at $2*f_s$. There is no visible difference between the ideal full rate DAC and the interleaving of two half rate DACs with this invention.

In embodiments of the present invention the clock feedthrough is canceled, and no additional frequency spurs are present.

It is an advantage of embodiments of the present invention that the spectrum of the interleaved signal is not altered:
  The sinc of the equivalent double rate DAC is equal to the theoretical sinc function
  No additional frequency spurs/images due to clocking in the interleaver are generated It is an advantage of embodiments of the present invention that they include a feed-forward equalizer (FFE) which naturally follows from the proposed interleaver architecture without the need to place an FFE in front or after the interleaver.

In summary, in FIG. 1 for each input terminal the signal at the input terminal is mixed with a clock signal. The mixed signal passes through a variable gain stage with gain b. The functionality of the mixer and variable gain amplifiers b can be interchanged. In parallel, the unmodified input signal also passes through a different variable gain stage with gain a and is added to the mixed signal. This creates a return-to-zero (RZ) representation of the input signal. Thanks to the 180 degrees phase difference of the clock signal, the two return-to-zero signals are also 180 degrees out of phase. By adding both return-to-zero signals together, the two clock signals that are present in the return-to-zero signals cancel out and the interleaved signal remains. To have perfect interleaving, a needs to be equal to b. However, when a is not equal to b, the interleaver also behaves as an equalizer.

Figure 2:
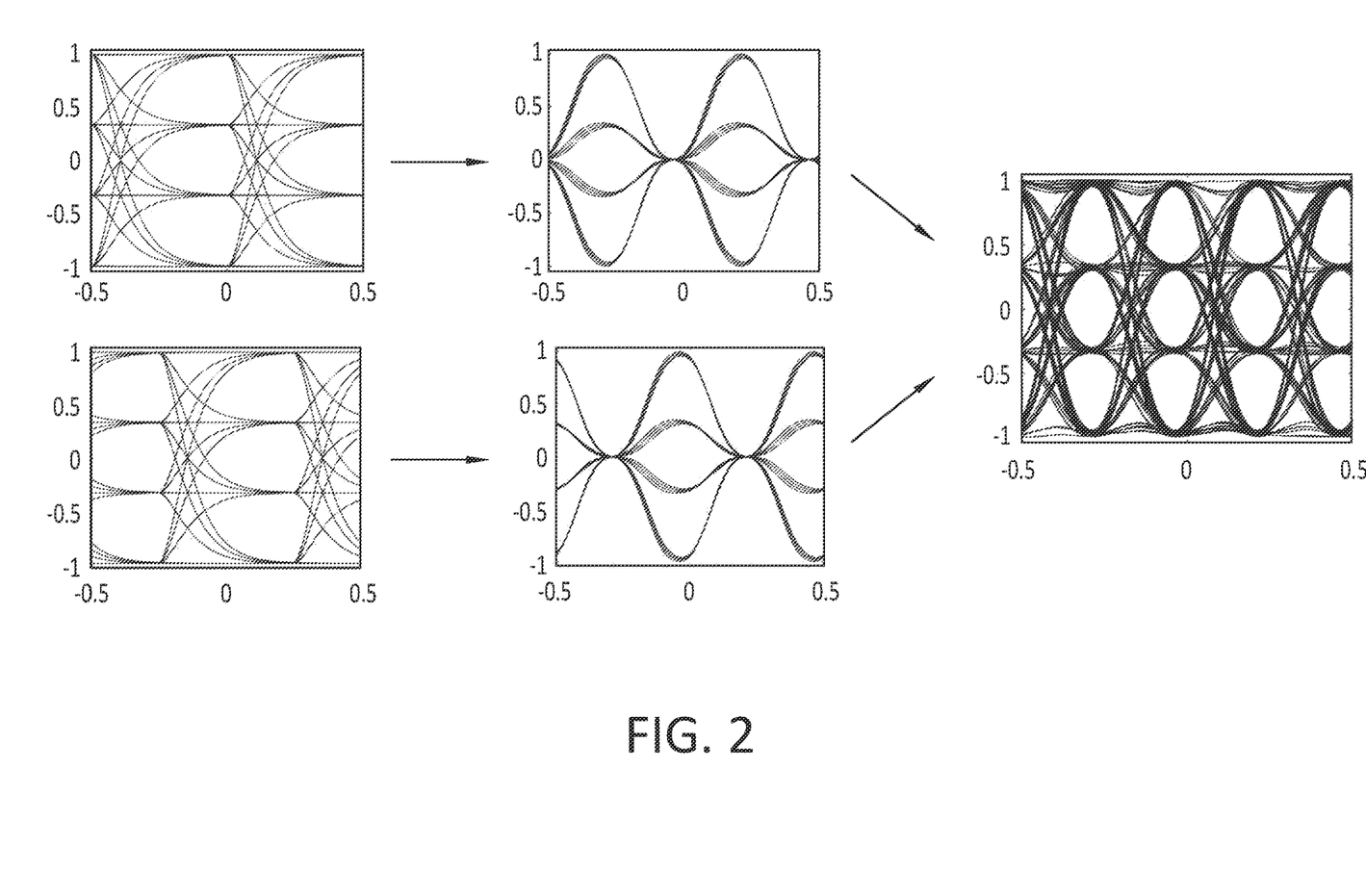
FIG. 2 shows eye diagrams of signals at different points in an interleaver in accordance with embodiments of the present invention.

The left diagrams in FIG. 2 show the eye diagrams of signals at the input terminals of the interleaver. From these input signal the return-to-zero signals are generated. The eye diagrams thereof are shown in the middle graphs of FIG. 2. The eye-diagram on the right shows the eye diagram of the interleaved signal after summing the return-to-zero signals. For all eye diagrams in this and the following figures the amplitude is shown in function of the time (in arbitrary units).

Figure 3:
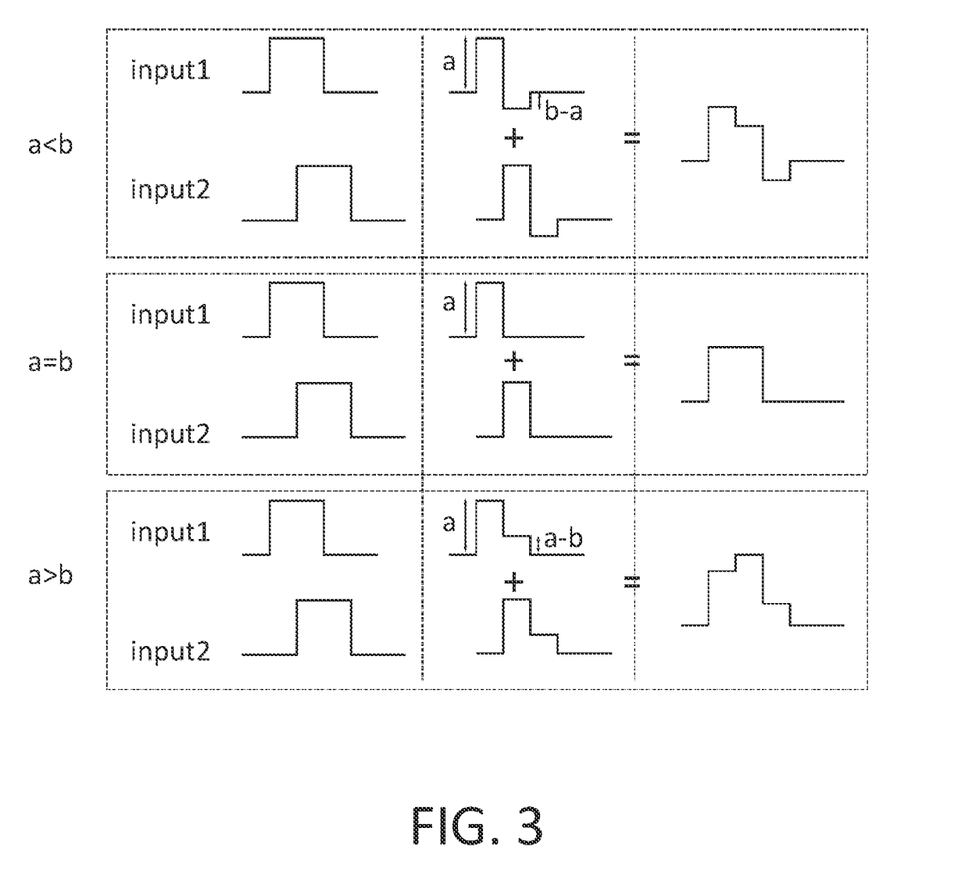
FIG. 3 shows schematical drawings of the input signals and the obtained combinations thereof for different gains of the first gain stage and the second gain stage in accordance with embodiments of the present invention.

In the exemplary interleaver illustrated in FIG. 1, combined interleaving and feed forward equalization is achieved as described below and as illustrated in FIG. 3. The return-to-zero generation leaves the signal unmodified for half of the symbol period and the other half it pushes the symbol to zero. Thanks to the 180 degrees phase shift between both clock signals, when input1 (the signal from the first input terminal) is pushed to zero, input2 (the signal from the second input terminal) is left unmodified and vice versa.

If both RZ signals are added (and a=b), the interleaved signal is obtained. The part of the signal that is pushed to zero still contains valuable information and can be used to perform equalization. Because input1 and input2 are being interleaved, at a certain discrete time step of the interleaver, input1 comes before input2. This means that the information hidden in the zero of input1 can be used to equalize the current symbol of input2 by pushing the signal beyond zero (a<b) or by not completely pushing it to zero (a>b). The same reasoning can be followed for equalizing the symbol of input1.

Figure 8:
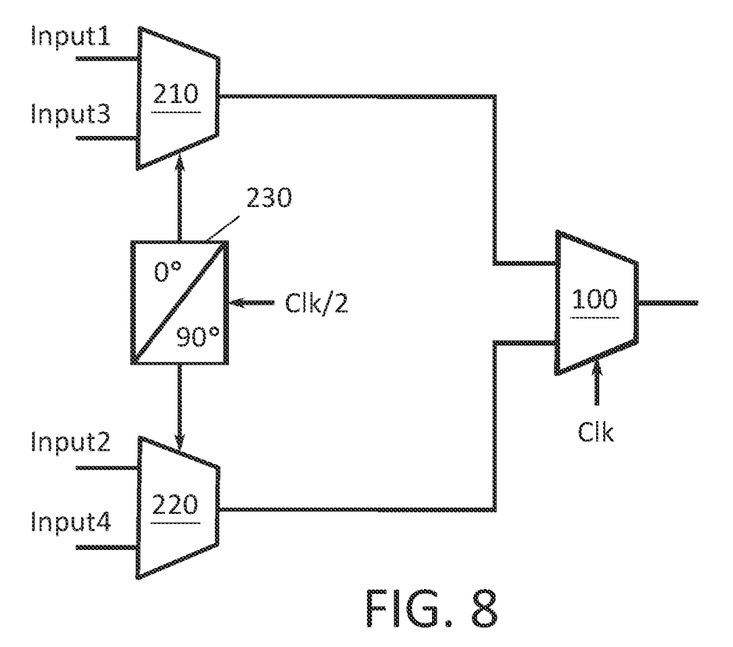
FIG. 8 shows a schematic drawing of a staged interleaver which is used in 4-1 mode in accordance with embodiments of the present invention.

In a second aspect embodiments of the present invention relate to a staged interleaver. Such a staged interleaver comprises at least two stages of which at least:
  a second stage comprising an interleaver 100 in accordance with embodiments of the present invention, and a first stage comprising at least a first and a second interleaver 210, 220 having the features of an interleaver in accordance with embodiments of the present invention except for the fact that the second gain of one of the signal paths may be zero.

The output terminals of the interleavers of the first stage are connected with the input terminals of the signal paths of the interleaver of the second stage.

In an exemplary embodiment of the present invention the interleaver of the second stage comprises two signal paths and the first stage comprises two interleavers. The output terminal of the first interleaver of the first stage is connected with the input terminal of the first signal path of the interleaver of the second stage, and the output terminal of the second interleaver of the first stage is connected with the input terminal of the second signal path of the interleaver of the second stage.

In embodiments of the present invention the first stage comprises a clock module 230 adapted for generating a clock for the interleavers of the first stage. The clock module of the first stage is for example adapted for generating a first clock signal and a second clock signal starting from an input clock such that the second clock signal is 90° out of phase with the first clock signal. The input clock of the first stage may thereby have a clock rate which is half of the clock rate of the second stage interleavers.

In embodiments of the present invention the input clock of the first stage interleaver has a clock rate which is half of the clock rate of the second stage interleavers.

Figure 4:
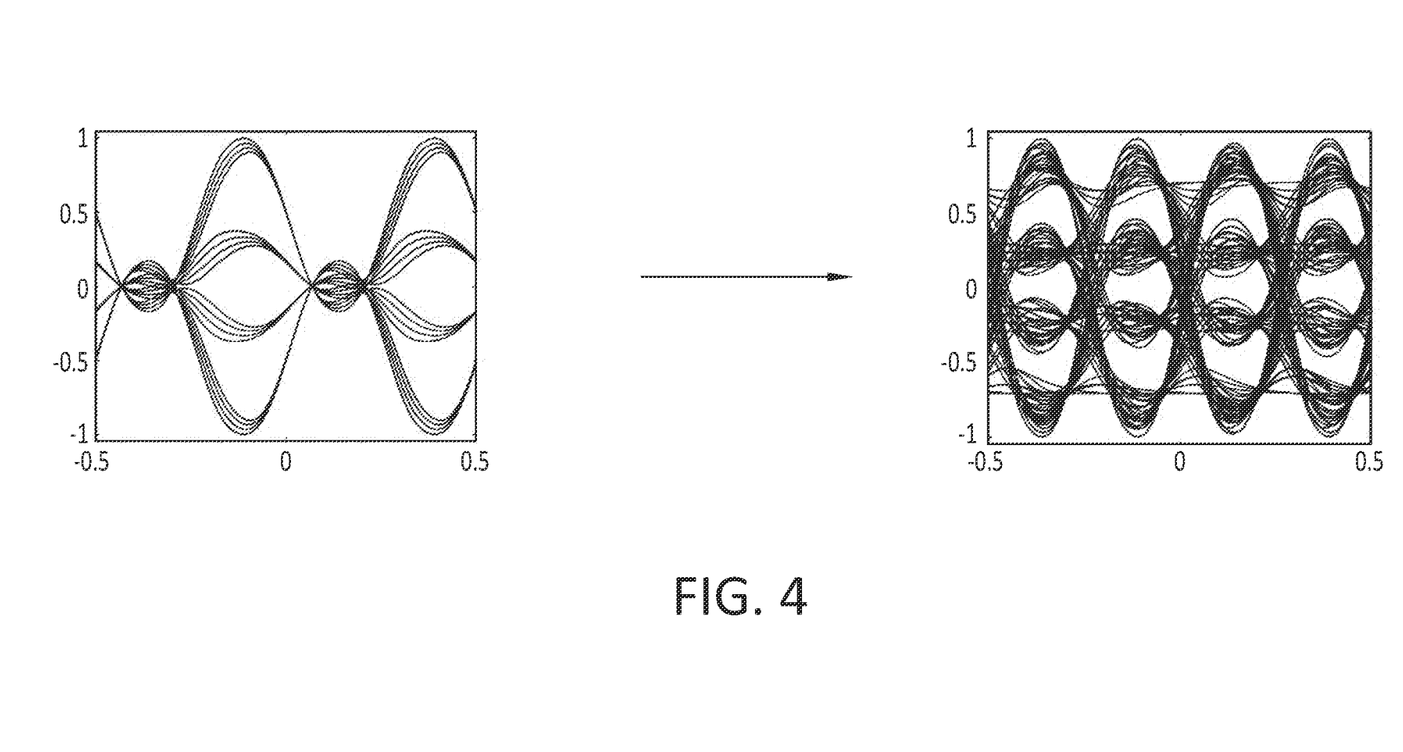
FIG. 4 and FIG. 5 show eye-diagrams of signals of a PAM-4 equalizer example in accordance with embodiments of the present invention.

FIG. 4 shows eye-diagrams of signals of a PAM-4 equalizer example in accordance with an exemplary embodiment of the present invention. In this example the curves of the eye-diagram of the signal at the output of a signal path is going beyond zero. The graph also shows the eye-diagram of the output of the interleaver. This eye diagram is obtained after making the summation of the signals at the end of the signal paths.

Figure 5:
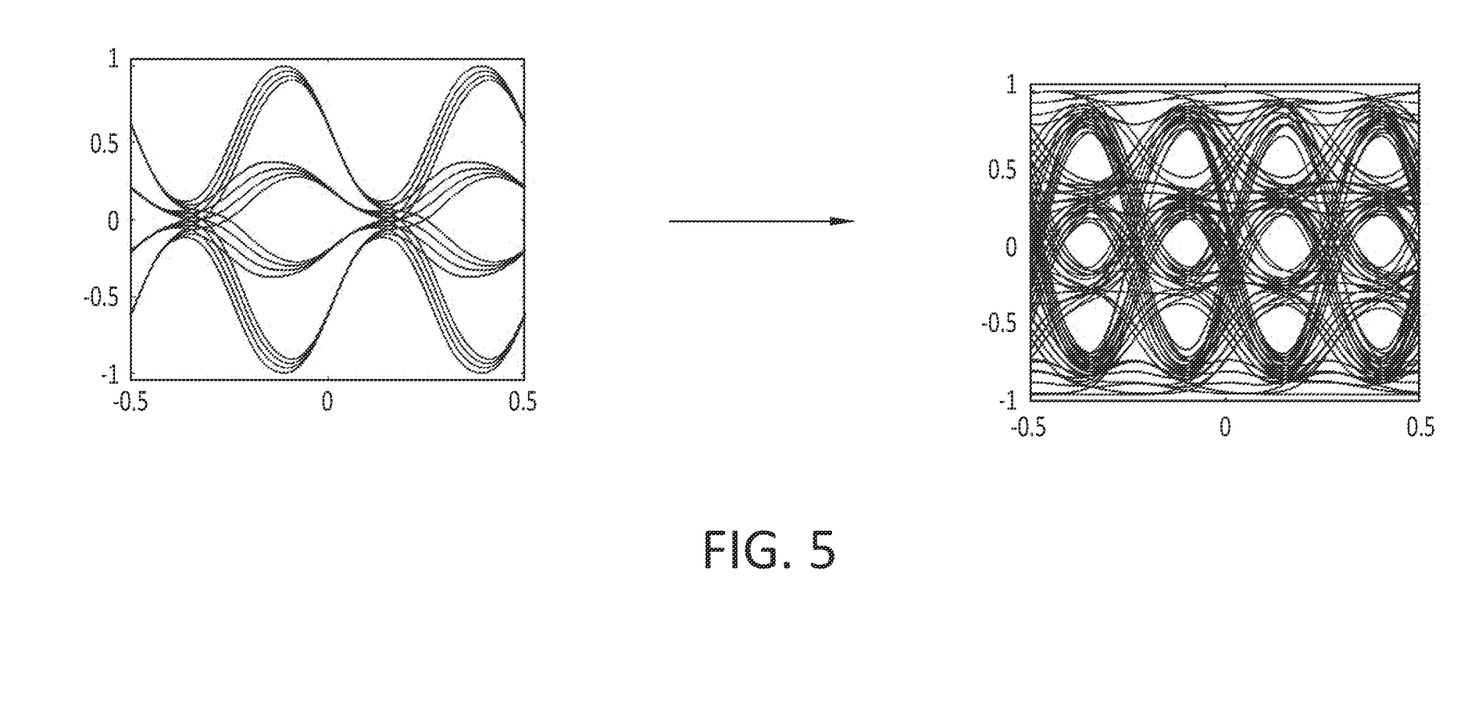

FIG. 5 also shows eye-diagrams of signals of a PAM-4 equalizer example. In this example low pass filtering is illustrated.

Figure 6:
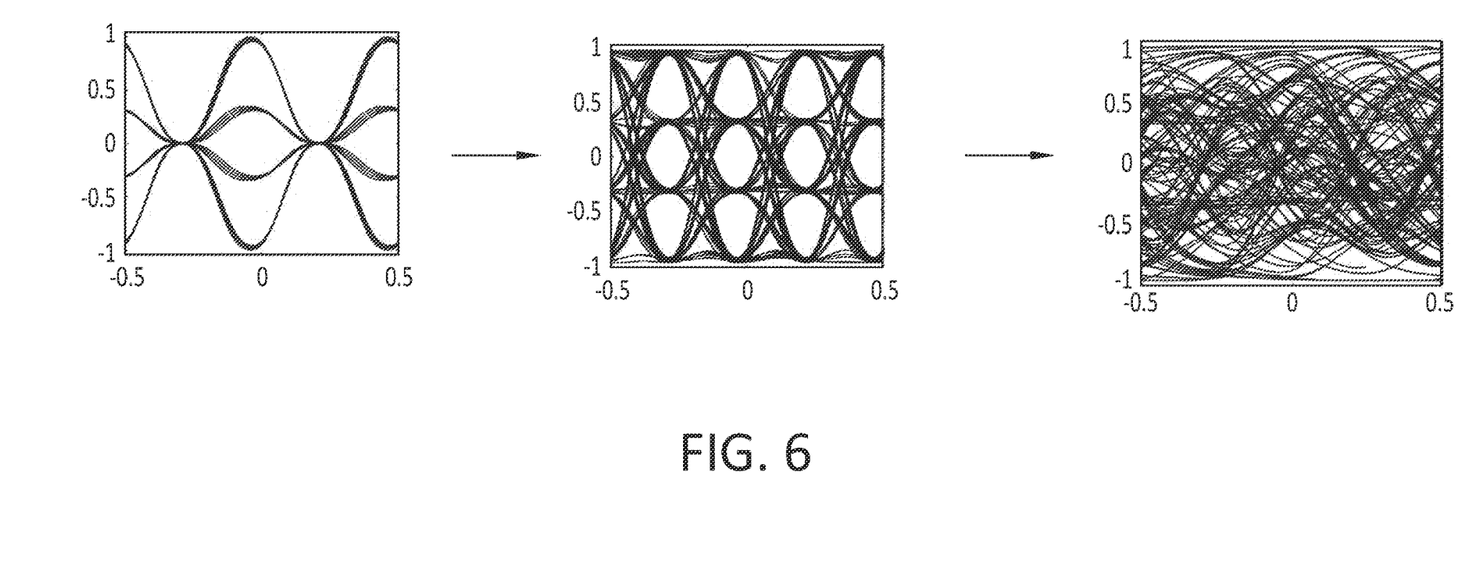
FIG. 6 shows the eye diagrams of a signal passing through an interleaver in accordance with embodiments of the present invention and through a channel when no equalization is applied.
Figure 7:
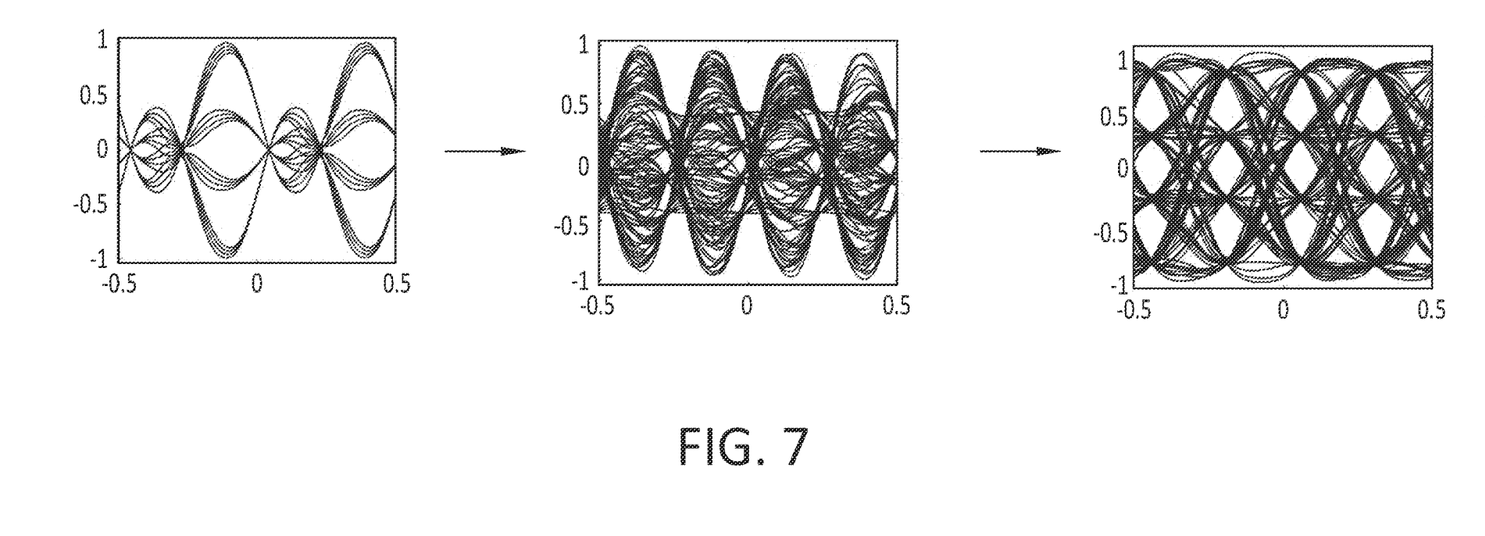
FIG. 7 shows the eye diagrams of a signal passing through an interleaver in accordance with embodiments of the present invention and through a channel when equalization is applied.

FIG. 6 and FIG. 7 each show 3 different eye-diagrams. The left eye-diagram shows the output of a signal path of an interleaver in accordance with embodiments of the present invention. The middle eye-diagram shows the output of the interleaver and the right eye-diagram shows the signal after it has passed through a channel. In the case of FIG. 6 no equalization was applied whereas in the case of FIG. 7 the gain a was different from the gain b.

The basic interleaving blocks may be combined into a binary tree structure such as illustrated in FIG. 8. In this schematic drawing the first stage comprising a first and a second interleaver 210, 220 as well as the second stage comprising the interleaver 100 are shown. A clock module 230 is providing clock signals to the first and second interleaver of the first stage. The applied clock has half the clock rate of the clock applied to the interleaver 100 of the second stage.

At the output of the interleavers 210, 220 of the first stage an intermediate interleaved output is obtained. These intermediate interleaved outputs are combined in the interleaver 100 of the second stage to obtain the interleaved output.

The invention is not limited to a binary tree structures. It may for example be possible that more than 2, for example 4 signal paths are placed in parallel such that the output signals from the signal paths are added together by the adder (e.g. a 4-input adder).

By combining the basic interleaving blocks this also automatically increases the order of the equalizer. The staged interleaver illustrated in FIG. 8 is adapted for interleaving 4 inputs. The staged interleaver in FIG. 8 is used in 4-1 mode.

Figure 9:
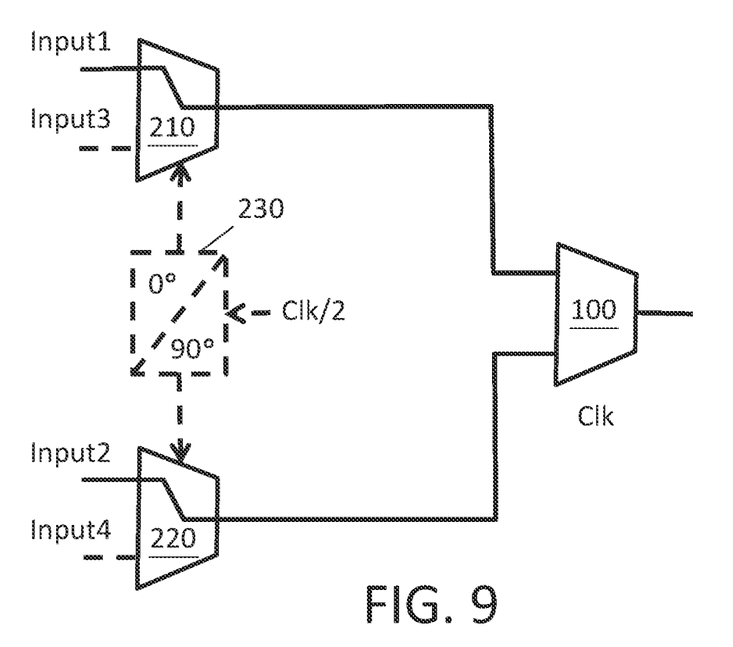
FIG. 9 shows a schematic drawing of a staged interleaver which is used in 2-1 mode in accordance with embodiments of the present invention.

The same structure may also be used in 2-1 mode as illustrated in FIG. 9. In this example the gain b is zero for the interleavers of the first stage.

No mixing is done in the first stage and hence also no clock signal must be applied to the interleavers of the first stage.

Figure 10:
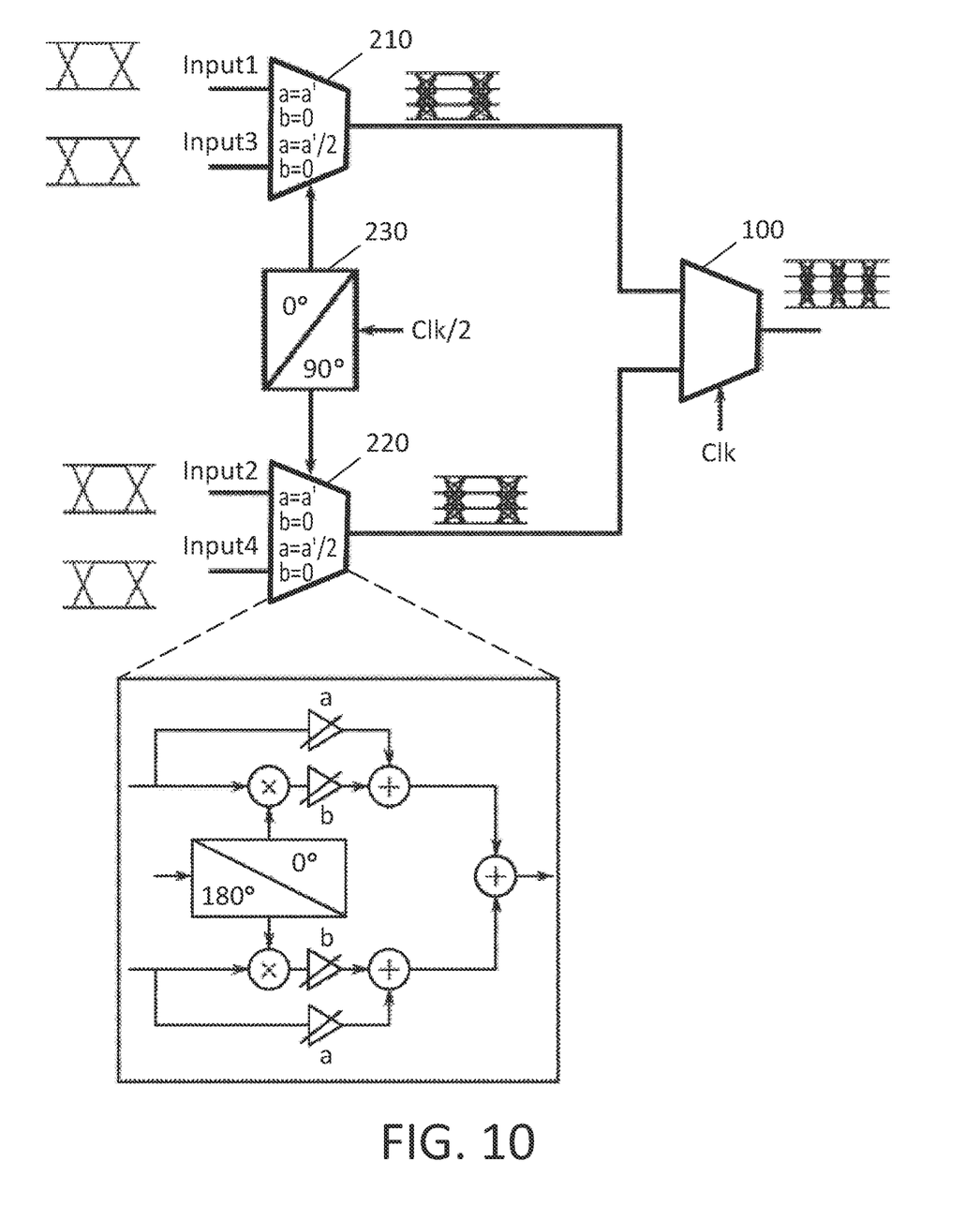
FIG. 10 shows a schematic drawing of a staged interleaver which is configured for PAM4 generation in accordance with embodiments of the present invention.

The same structure can be used to combine parallel lower order modulation schemes into an output stream with higher modulation and baud rate. An example of PAM-4 generation from 4 half-rate NRZ streams using a 4-to-1 interleaver is given in FIG. 10. In this exemplary embodiment of the present invention the first gain (a=a'/2) of the second signal path is half of the first gain (a=a') of the first signal path for the interleavers 210, 220 of the first stage. In this exemplary embodiment of the present invention the second gain of the second signal paths is zero (b=0) for the interleavers 210, 220 of the first stage.

Figure 11:
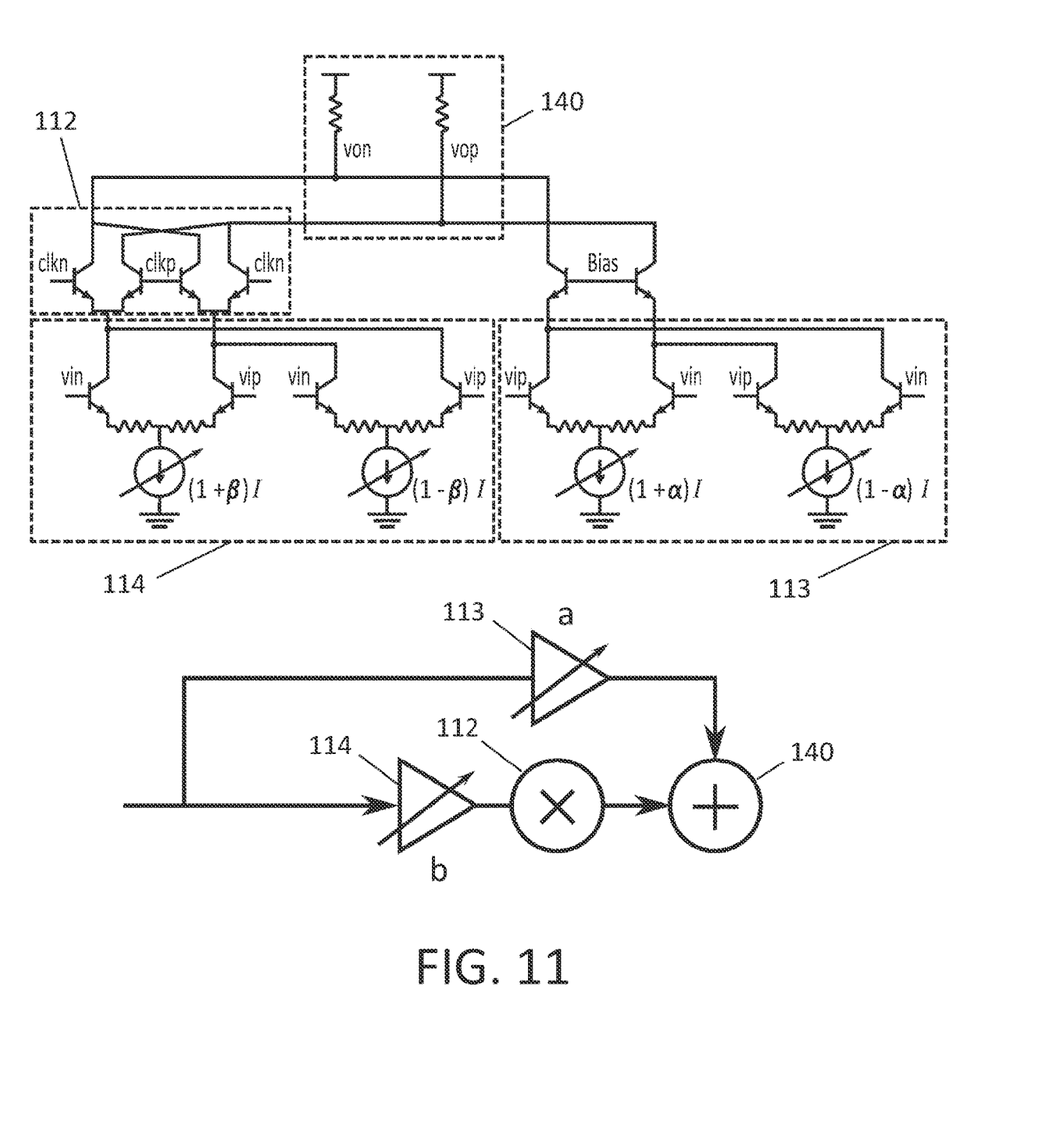
FIGS. 11 to 13 show possible circuit implementations of the different building blocks of an interleaver in accordance with embodiments of the present invention.
Figure 12:
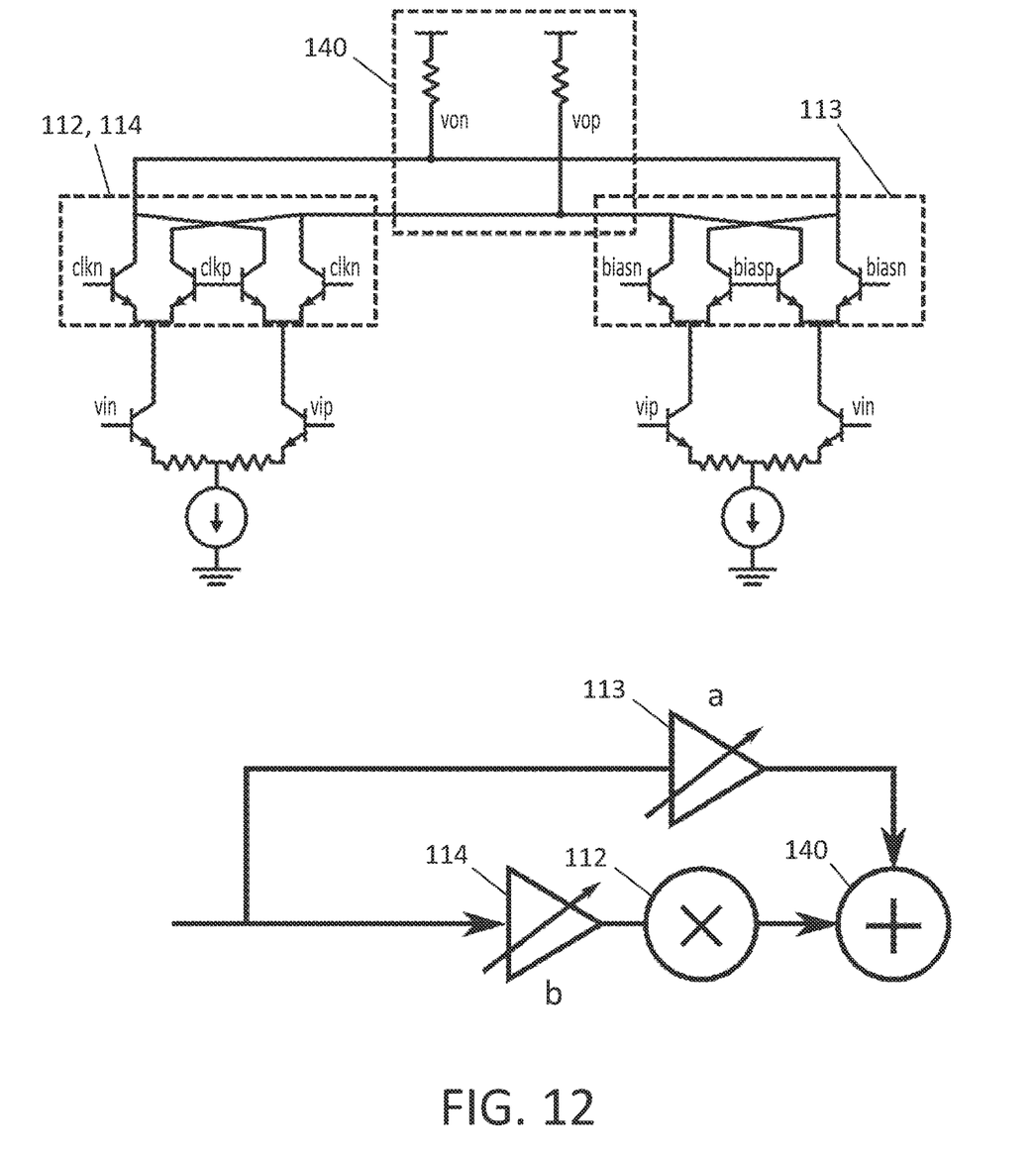
Figure 13:
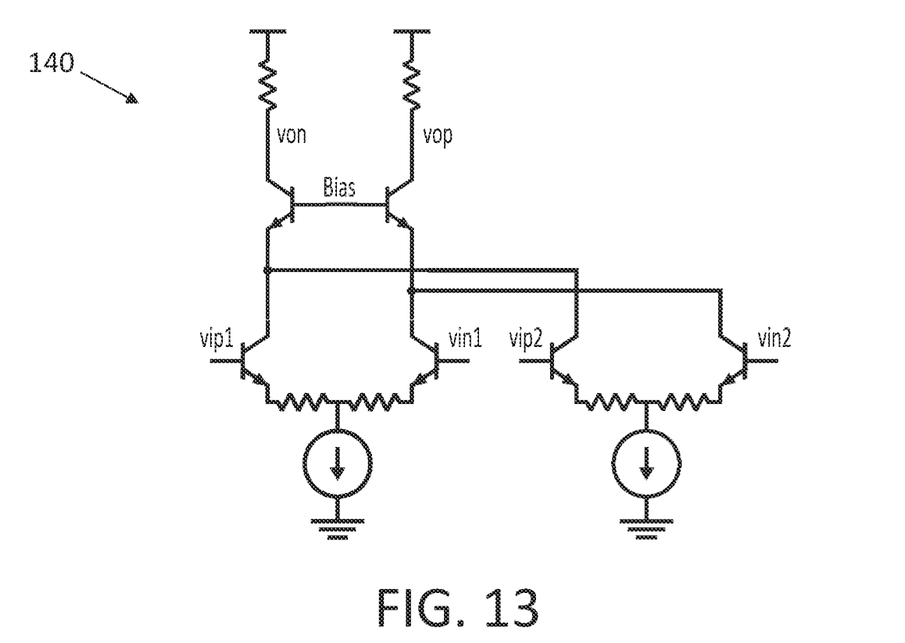

A possible circuit implementation of the different building blocks is given in FIG. 11 to FIG. 13. The circuits show a fully differential implementation.

FIG. 11 and FIG. 12 show a possible implementation of the RZ generator. In FIG. 11 the variable gain amplifiers (VGA) 113, 114 giving the gains a and b are implemented by two differential pairs in parallel. The gain is generated by subtracting the current generated in each differential pair. To keep the common mode voltage at the output constant, both differential pairs from the VGA are biased with complementary currents: if one differential pair is biased with $(1+\alpha)I$ then the other one is biased with $(1-\alpha)I$. The gain of the VGA is then proportional to $\alpha$. The multiplier or mixer 112 is implemented by alternating the sign of the current generated by the VGA. The sign alternation is performed by cascode transistors that are driven by the clock (clkn, clkp). Finally, the currents going from the mixer and the other VGA are summed in the output resistors 140. In the implementation of the return-to-zero generation circuit illustrated in FIG. 11 the location of the amplifier b and mixer are interchanged for easier circuit implementation. In FIG. 12, the VGA's 113, 114 giving the gains a and b are implemented by a gilbert cell. The gain is altered by placing an offset between biasn and biasp.

The summer 140 that adds two RZ signals together is shown in FIG. 13. The currents of two differential pairs are summed in the output resistors. Here, the bias current in each differential pair needs to be equal to ensure equal gain for each branch. This is different from the previously discussed VGA where the currents are subtracted from each other and the current in each differential pair of the VGA is not necessarily equal.

In embodiments of the present invention the first gain of the signal paths may be zero for the interleavers of the first stage. This may for example prevent leaking of an input signal if this input signal is not wanted.

An interleaver in accordance with embodiments of the present invention may be implemented using bipolar transistors. The invention is, however, not limited thereto. The concept is also not bound to integrated circuits.

Figure 14:
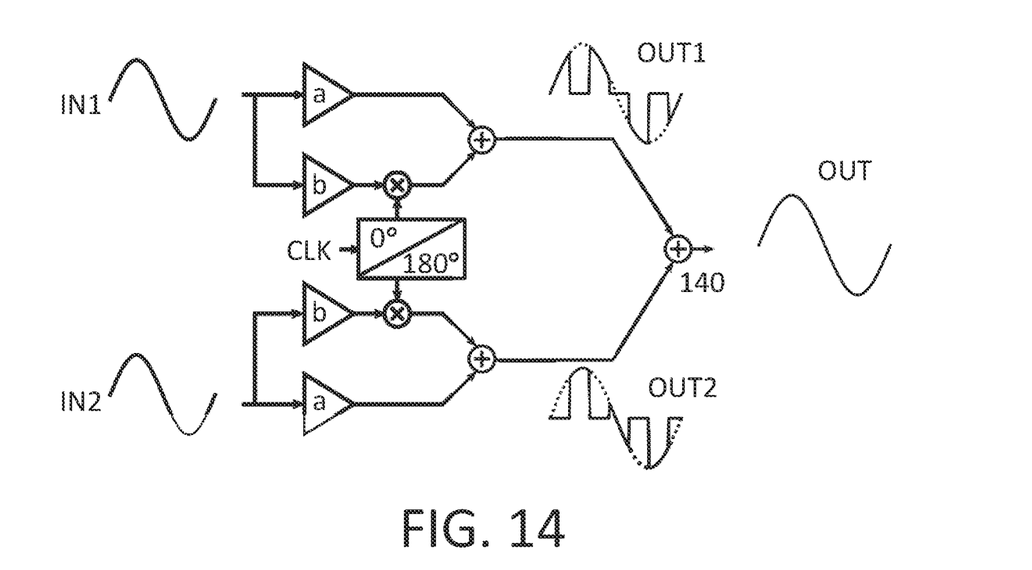
FIG. 14 shows the same interleaver as in FIG. 1, except for the functionality of the mixers and the variable gain amplifiers which is interchanged, in accordance with embodiments of the present invention.

FIG. 14 shows the same interleaver as FIG. 1, except for the functionality of the mixers and the variable gain amplifiers which is interchanged. It shows two input signals IN1, IN2, at half rate. The signal OUT1 is obtained at the output of the first signal path and the signal OUT2 is obtained at the output of the second signal path. The interleaved output OUT at full rate is obtained at the output of the adder.

The invention claimed is:

1. An interleaver for combining at least two incoming signals into an analog output signal, the interleaver comprising:
   at least a first signal path and a second signal path,
   each signal path comprising:
   an input terminal for receiving an incoming signal,
   a first gain stage adapted for multiplying a signal coming from the input terminal with a predefined or modifiable first gain (a) to obtain a first signal,
   a mixer and a second gain stage adapted for multiplying a signal coming from the input terminal with a predefined or modifiable second gain (b) before or after mixing it with a clock signal using the mixer to obtain a second signal,
   an adder adapted for adding the first signal and the second signal to obtain an output signal of the signal path wherein the first and second gain are different from zero,
   the interleaver moreover comprising an adder adapted for adding the output signals from the signal paths to obtain the analog signal at an output terminal of the interleaver.

2. The interleaver according to claim 1, the interleaver comprising a clock module adapted for generating clock signals for the mixers of the signal paths.

3. The interleaver according to claim 1, wherein for each signal path the first gain is equal to the second gain.

4. The interleaver according to claim 1, wherein for at least one of the signal paths the first gain is different from the second gain.

5. The interleaver according to claim 1 wherein each gain stage is implemented by two differential pairs in parallel and wherein each gain stage is adapted for generating a current by subtracting currents generated by the differential pairs.

6. The interleaver according to claim 5 wherein each gain stage is adapted for biasing the differential pairs with complementary currents.

7. The interleaver according to claim 5 wherein the mixer of each signal path comprises cascode transistors which are adapted to be driven by a clock signal and for alternating the sign of the current generated by the gain stage at a rate of the clock signal.

8. The interleaver according to claim 1 wherein the adder of each signal path comprises output resistors which are configured for summing the first signal and the second signal of the signal path.

9. The interleaver according to claim 1
wherein the adder adapted for adding the output signal from the first signal path with the output signal from the second signal path comprises two differential pairs of which one is adapted for generating a current in function of the output signal from the first signal path, and of which the other one is adapted for generating a current in function of the output signal from the second signal path, and
wherein the obtained currents are summed in output resistors.

10. A staged interleaver comprising at least two stages of which at least:

a second stage comprising an interleaver according to claim 1, and
a first stage comprising at least a first and a second interleaver having the features of the interleaver except for the fact that the second gain of one of the signal paths may be zero,
wherein the output terminals of the first and second interleaver of the first stage are connected with the input terminals of the signal paths of the interleaver of the second stage.

11. The staged interleaver according to claim 10, wherein the second gain of the signal paths is zero for the interleavers of the first stage.

12. The staged interleaver according to claim 10, wherein, for the interleavers of the first stage, the first gain of the second signal path is half of the first gain of the first signal path.

13. The staged interleaver according to claim 12, wherein the second gain of the second signal paths is zero for the interleavers of the first stage.

* * * * *